(12) United States Patent
Choi

(10) Patent No.: US 6,798,008 B2
(45) Date of Patent: Sep. 28, 2004

(54) NON-VOLATILE DYNAMIC RANDOM ACCESS MEMORY

(75) Inventor: Kyu Hyun Choi, Cupertino, CA (US)

(73) Assignee: 02IC, Inc., Cupertino, CA (US)

( * ) Notice: Subject to any disclaimer, the term of this patent is extended or adjusted under 35 U.S.C. 154(b) by 0 days.

(21) Appl. No.: 10/394,407

(22) Filed: Mar. 19, 2003

(65) Prior Publication Data

US 2004/0016947 A1 Jan. 29, 2004

Related U.S. Application Data

(60) Provisional application No. 60/366,046, filed on Mar. 19, 2002.

(51) Int. Cl.[7] .............................................. H01L 27/108
(52) U.S. Cl. ........................ 257/298; 257/296; 257/300; 257/315; 365/185.08; 365/186.01
(58) Field of Search ................................ 257/298, 296, 257/300, 314, 315, 316, 317, 319; 365/185.08, 186.01

(56) References Cited

U.S. PATENT DOCUMENTS

| | | | |
|---|---|---|---|
| 4,193,128 A | 3/1980 | Brewer | |
| 4,271,487 A | 6/1981 | Craycraft et al. | |
| 4,462,090 A | 7/1984 | Iizuka | |
| 5,051,951 A | 9/1991 | Maly et al. | |
| 5,396,461 A | * 3/1995 | Fukumoto | 365/189.05 |
| 5,619,470 A | * 4/1997 | Fukumoto | 365/228 |
| 5,646,885 A | 7/1997 | Matsuo et al. | |
| 5,986,932 A | 11/1999 | Ratnakumar et al. | |
| 6,222,765 B1 | 4/2001 | Nojima | |
| 6,266,272 B1 | * 7/2001 | Kirihata et al. | 365/185.08 |
| 6,285,575 B1 | 9/2001 | Miwa | |
| 6,363,011 B1 | 3/2002 | Hirose et al. | |
| 6,370,058 B1 | * 4/2002 | Fukumoto | 365/185.08 |
| 6,414,873 B1 | 7/2002 | Herdt | |
| 6,426,894 B1 | 7/2002 | Hirano | |
| 6,556,487 B1 | 4/2003 | Ratnakumar et al. | |
| 6,654,273 B2 | 11/2003 | Miwa et al. | |

* cited by examiner

*Primary Examiner*—Kevin M. Picardat
(74) *Attorney, Agent, or Firm*—Townsend and Townsend and Crew LLP; Ardeshir Tabibi

(57) ABSTRACT

In accordance with the present invention, a memory cell includes a non-volatile device and a DRAM cell. The DRAM cell further includes an MOS transistor and a capacitor. The non-volatile device include a control gate region and a guiding gate region that may partially overlap. The non-volatile device is erased prior to being programmed. Programming of the non-volatile device may be done via hot-electron injection or Fowler-Nordheim tunneling. When a power failure occurs, the data stored in the DRAM is loaded in the non-volatile devices. After the power is restored, the data stored in the non-volatile device is restored in the DRAM cell.

16 Claims, 4 Drawing Sheets

NON-VOLATILE DYNAMIC RANDOM ACCESS MEMORY

CROSS-REFERENCES TO RELATED APPLICATIONS

The present application claims benefit of the filing date of U.S. provisional application No. 60/366,046 filed on Mar. 19, 2002, entitled "Integrated RAM and Non-Volatile DRAM Memory Cell Method And Structure," the entire content of which is incorporated herein by reference.

The present application is related to copending application Ser. No. 10/394,417,filed on Mar. 19, 2003, entitled "Non-Volatile Memory Device," filed contemporaneously herewith, assigned to the same assignee, and incorporated herein by reference in its entirety.

The present application is also related to copending application Ser. No. 10/394,496 file on Mar. 19, 2003, entitled "Non-Volatile Differential Dynamic Random Access Memory," filed contemporaneously herewith, assigned to the same assignee, and incorporated herein by reference in their entirety.

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK.

Not Applicable

BACKGROUND OF THE INVENTION

The present invention relates to semiconductor integrated circuits. More particularly, the invention provides a semiconductor memory that has integrated non-volatile and dynamic random access memory cells. Although the invention has been applied to a single integrated circuit device in a memory application, there can be other alternatives, variations, and modifications. For example, the invention can be applied to embedded memory applications, including those with logic or micro circuits, and the like.

Semiconductor memory devices have been widely used in electronic systems to store data. There are generally two types of memories, including non-volatile and volatile memories. The volatile memory, such as a Static Random Access Memory (SRAM) or a Dynamic Random Access Memory (DRAM), loses its stored data if the power applied has been turned off. SRAMs and DRAMs often include a multitude of memory cells disposed in a two dimensional array. Due to its larger memory cell size, an SRAM is typically more expensive to manufacture than a DRAM. An SRAM typically, however, has a smaller read access time and a lower power consumption than a DRAM. Therefore, where fast access to data or low power is needed, SRAMs are often used to store the data.

Non-volatile semiconductor memory devices are also well known. A non-volatile semiconductor memory device, such as flash Erasable Programmable Read Only Memory (Flash EPROM), Electrically Erasable Programmable Read Only Memory (EEPROM) or, Metal Nitride Oxide Semiconductor (MNOS), retains its charge even after the power applied thereto is turned off. Therefore, where loss of data due to power failure or termination is unacceptable, a non-volatile memory is used to store the data.

Unfortunately, the non-volatile semiconductor memory is typically slower to operate than a volatile memory. Therefore, where fast store and retrieval of data is required, the non-volatile memory is not typically used. Furthermore, the non-volatile memory often requires a high voltage, e.g., 12 volts, to program or erase. Such high voltages may cause a number of disadvantages. The high voltage increases the power consumption and thus shortens the lifetime of the battery powering the memory. The high voltage may degrade the ability of the memory to retain its charges due to hot-electron injection. The high voltage may cause the memory cells to be over-erased during erase cycles. Cell over-erase results in faulty readout of data stored in the memory cells.

The growth in demand for battery-operated portable electronic devices, such as cellular phones or personal organizers, has brought to the fore the need to dispose both volatile as well as non-volatile memories within the same portable device. When disposed in the same electronic device, the volatile memory is typically loaded with data during a configuration cycle. The volatile memory thus provides fast access to the stored data. To prevent loss of data in the event of a power failure, data stored in the volatile memory is often also loaded into the non-volatile memory either during the configuration cycle, or while the power failure is in progress. After power is restored, data stored in the non-volatile memory is read and stored in the non-volatile memory for future access. Unfortunately, most of the portable electronic devices may still require at least two devices, including the non-volatile and volatile, to carry out backup operations. Two devices are often required since each of the devices often rely on different process technologies, which are often incompatible with each other.

To increase the battery life and reduce the cost associated with disposing both non-volatile and volatile memory devices in the same electronic device, non-volatile SRAMs and non-volatile DRAMs have been developed. Such devices have the non-volatile characteristics of non-volatile memories, i.e., retain their charge during a power-off cycle, but provide the relatively fast access times of the volatile memories.

As merely an example, FIG. 1 is a transistor schematic diagram of a prior art non-volatile DRAM 10. Non-volatile DRAM 10 includes transistors 12, 14, 16 and EEPROM cell 18. The control gate and the drain of EEPROM cell 18 form the DRAM capacitor. Transistors 12 and 14 are parts of the DRAM cell. Transistor 16 is the mode selection transistor and thus selects between the EEPROM and the DRAM mode. EEPROM cell 18 may suffer from the high voltage problems, is relatively large and thus is expensive.

Accordingly, a need continues to exist for a relatively small non-volatile DRAM that consumes less power than those in the prior art, does not suffer from read errors caused by over-erase, and is not degraded due to hot-electron injection.

While the invention is described in conjunction with the preferred embodiments, this description is not intended in any way as a limitation to the scope of the invention. Modifications, changes, and variations, which are apparent to those skilled in the art can be made in the arrangement, operation and details of construction of the invention disclosed herein without departing from the spirit and scope of the invention.

BRIEF SUMMARY OF THE INVENTION

According to the present invention, an improved memory device and method is provided. More particularly, the invention provides a semiconductor memory that has integrated non-volatile and dynamic random access memory cells. Although the invention has been applied to a single integrated circuit device in a memory application, there can be other alternatives, variations, and modifications. For example, the invention can be applied to embedded memory applications, including those with logic or micro circuits, and the like.

In accordance with the present invention, a memory cell includes a non-volatile device and a dynamic random access memory (DRAM) cell. The DRAM cell includes an MOS transistor having a drain terminal coupled to a bitline associated with the memory cell, a gate terminal coupled to a first terminal of the memory cell, and a source terminal coupled a first node of the memory cell having an associated capacitance. The non-volatile device is adapted to receive from or supply charges to the DRAM cell. The non-volatile device includes a substrate region coupled to a second terminal of the memory, a source region formed in the substrate region and coupled to the first node, a drain region formed in the substrate region and separated form the source region by a first channel region, a first gate overlaying a first portion of the channel region and separated therefrom via a first insulating layer, and a second gate overlaying a second portion of the channel region and separated therefrom via a second insulating layer. The first portion and second portions of the channel region do not overlap. The drain region of the non-volatile device is coupled to the third terminal of the memory cell. The first gate of the non-volatile device is coupled to the fourth terminal of the memory cell. The second gate of the non-volatile device is coupled to the fifth terminal of the memory cell.

The DRAM cell may be programmed during a write cycle. During such a programming cycle, the first terminal of the memory cell is raised to a high voltage to enable the voltage present on the bitline associated with the memory to be stored across the DRAM's capacitor. Data may also be transferred to the DRAM cells from the non-volatile devices after the non-volatile devices has been programmed. To load (store) the data stored in the non-volatile devices in the DRAM cell, the third, fourth and fifth terminals of the memory cell are raised to a relatively high first voltage and the first terminal of the memory cell is raised to a second relatively high voltage.

While the power is being turned off or is abruptly interrupted or as needed, the data stored in the DRAM cell is stored in the non-volatile device. Prior to storing the data in the non-volatile devices, the non-volatile device is erased by applying a relatively high negative voltage to the third terminal of the memory cell, while applying, e.g., 0 volt to the remaining terminals of the memory cell.

To reload the data in the DRAM cells after power is restored, a relatively high voltage is applied to the third, fourth and fifth terminals of the memory cell, and another relatively high voltage is applied to the first terminal of the memory cell. A read sensing voltage is applied to the bitline associated with the memory cell. The read sensing voltage is so selected as to disable current flow in the programmed non-volatile device and/or to enable current flow in the erased non-volatile device, thereby causing the DRAM cell to be reprogrammed with data it had prior to power supply termination or failure.

The accompanying drawings, which are incorporated in and form part of the specification, illustrate embodiments of the invention and, together with the description, sever to explain the principles of the invention.

DETAILED DESCRIPTION OF THE INVENTION

According to the present invention, an improved memory device and method is provided. More particularly, the invention provides a semiconductor memory that has integrated non-volatile and Dynamic random access memory cells. Although the invention has been applied to a single integrated circuit device in a memory application, there can be other alternatives, variations, and modifications. For example, the invention can be applied to embedded memory applications, including those with logic or microcircuits, and the like.

Figure 1:
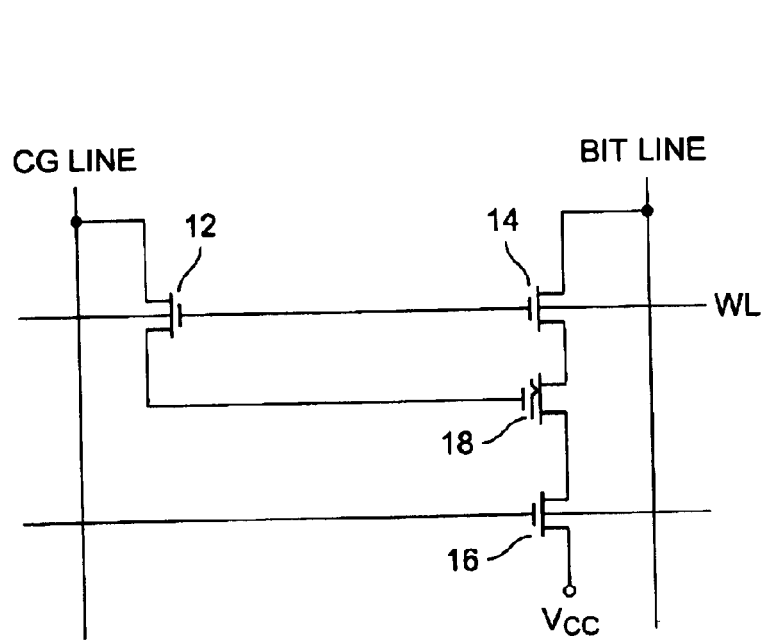
FIG. 1 is a simplified transistor schematic diagram of a non-volatile DRAM, as known in the prior art.
Figure 2:
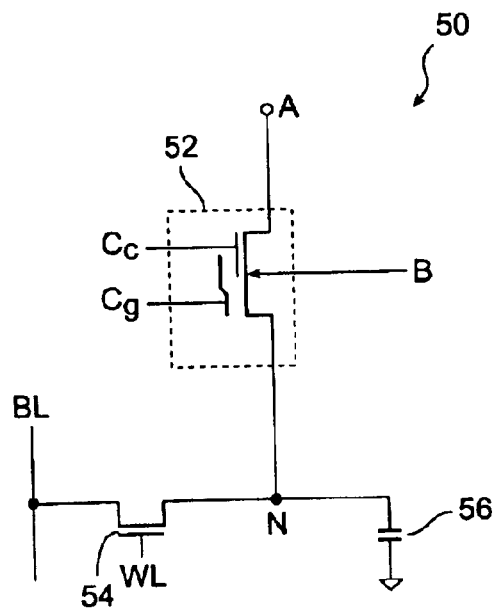
FIG. 2 is a simplified transistor schematic diagram of a non-volatile DRAM, in accordance with one embodiment of the present invention.

FIG. 2 is a transistor schematic diagram of a non-volatile dynamic random access memory (DRAM) 50. DRAM 50 includes non-volatile device 52, as well as MOS transistor 54 and capacitor 56 which together form a dynamic random access memory cell, in accordance with one embodiment of the present invention. This diagram is merely an example, which should not unduly limit the scope of the claims herein. One of ordinary skill in the art would recognize many other variations, modifications, and alternatives.

Non-volatile DRAM (hereinafter alternatively referred to as memory) 50 includes 6 terminals, namely Cg, Cc, WL, BL, A, B. Memory 50 may be part of a memory array (not shown) disposed in a semiconductor Integrated Circuit (IC) adapted, among other functions, to store and supply the stored data. Terminals BL typically forms a bitline of such a memory array and terminal WL typically forms a wordline of such a memory array. In the following terminal BL is alternatively referred to as bitlines BL. In the following terminal WL is alternatively referred to as wordline WL.

Figure 3:
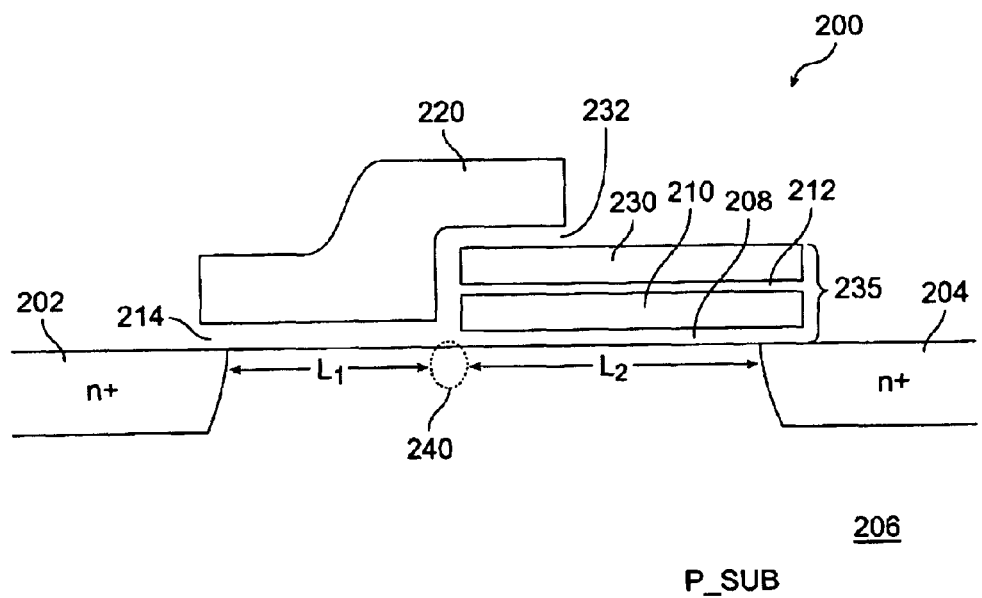
FIG. 3 is a cross-sectional view of a first embodiment of the non-volatile memory device disposed in the non-volatile DRAM of FIG. 2, in accordance with the present invention.
Figure 4:
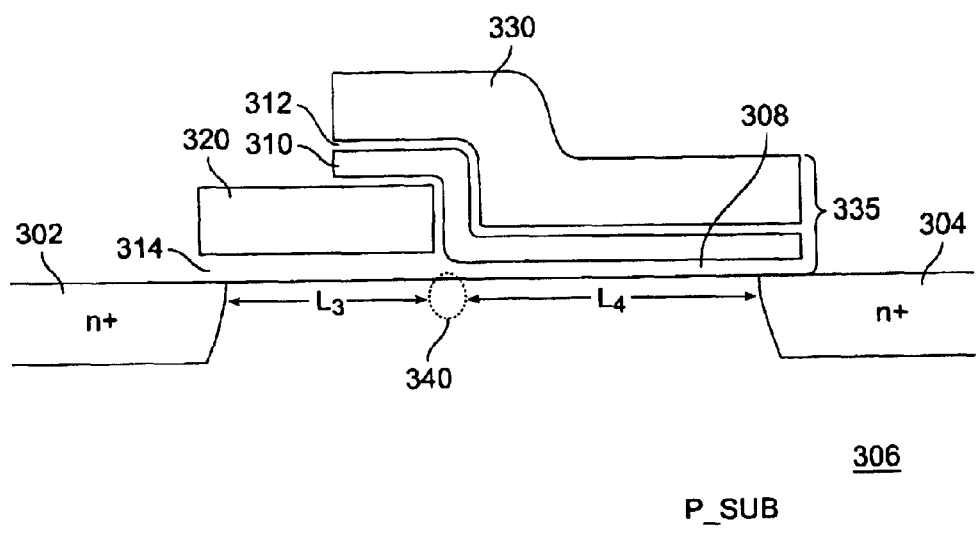
FIG. 4 is a cross-sectional view of a second embodiment of the non-volatile memory device disposed in the differential non-volatile DRAM of FIG. 2, in accordance with the present invention.

The gate and drains terminals of MOS transistor 54 are respectively coupled to wordline WL and bitline BL. The source terminal of MOS transistor 54 is coupled to the source terminal of non-volatile device 52 via node N. Non-volatile memory device 52 has a guiding gate region and a control gate region. The guiding gate and control gate regions of non-volatile device 52 are respectively coupled to input terminals Cg and Cc of memory 50. The drain region of non-volatile device 52 is coupled to input terminal A of memory 50. The substrate (i.e., the bulk or body) region of non-volatile device 52 is coupled to input terminal B of memory 50. FIGS. 3 and 4 show two different embodiments of non-volatile device 52, both of which embodiments are described in copending application Ser. No. 10/394,417, entitled "NON-VOLATILE MEMORY DEVICE", the content of which is incorporated herein by reference in its entirety.

As described above, transistor 54 together with the capacitance of node N form a DRAM cell. In the embodiment shown in FIG. 2, the capacitance at node C, i.e., capacitor 54, is a parasitic capacitance and includes the source capacitance of transistor 54 as well as the source capacitance of non-volatile device 52. Therefore, it is understood that in embodiment 50 of the memory, capacitor 54 is an intrinsic capacitance. It is understood that in other embodiments of the present invention, capacitor 54 may include capacitors that are actively formed, in addition to the intrinsic capacitors. For example, capacitor 54 may be formed from layers of poly-silicon insulated from one another by a dielectric, e.g., silicon dioxide, layer.

Programming the DRAM Cell

Figure 5:
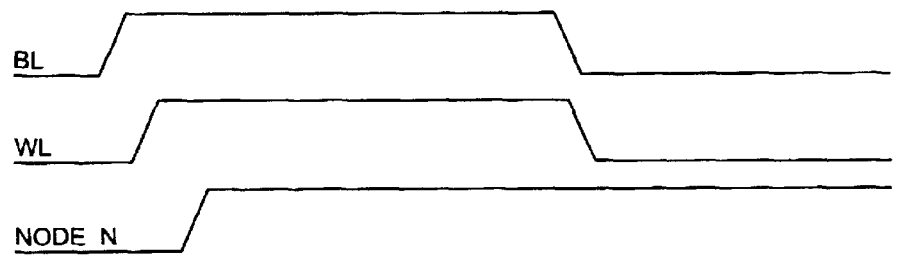
FIG. 5 is a simplified timing diagram of various signals of the non-volatile DRAM of FIG. 2 during a write cycle.

To store a 1 in the DRAM cell of memory 50, supply voltage Vcc is applied to bitline BL and a voltage that is greater than the Vcc voltage by the threshold voltage of MOS transistor 52, is applied to wordline WL, as shown in FIG. 5. In some embodiments of the present invention, supply voltage Vcc is between 1.2 to 5.5 volts and supply voltage Vss is at the ground potential (i.e., 0 volts). Guiding gate terminal Cg, control gate terminal Cc and terminal A are held at the ground potential. Because transistor 54 is in a conducting state, the voltage across capacitor 56 is raised to the bitline voltage Vcc. Since capacitor 54 is charged to Vcc, a 1 is stored in the DRAM cell. Transistor 54 may be turned on periodically during refresh cycles to ensure that capacitor 56 maintain its charge.

To store a 0 in the DRAM cell, voltage Vss is applied to bitline BL and a voltage greater than the Vcc is applied to wordline WL. Guiding gate terminal Cg, control gate terminal Cc and terminal A are held at the ground potential. Because transistor 54 is in a conducting state, capacitor 56 is discharged; therefore, the voltage across capacitor 56 is pulled to the Vss voltage. Since capacitor 54 is discharged to the ground potential, a 0 is stored in the DRAM cell. Transistor 54 may be turned on periodically during refresh cycles to ensure that capacitor 56 remains discharged.

Reading the DRAM Cell

Figure 6:
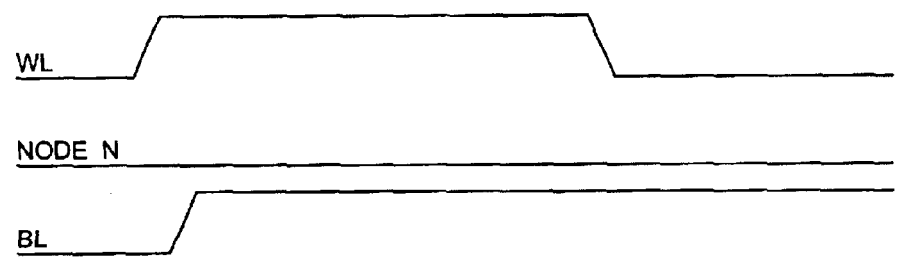
FIG. 6 is a simplified timing diagram of various signals of the non-volatile DRAM of FIG. 2 during a read cycle.

To read the data stored in the DRAM cell, terminals Cg, Cc and A are maintained at the ground potential to isolate node N. Supply voltage Vcc or a voltage greater than Vcc is applied to input terminal WL, thereby coupling capacitor 54 to bitline BL. The voltage present across capacitor 54 causes bitline BL voltage to so change; this enables a read circuitry, such as a sense amplifier (not shown) to sense this voltage and generate a corresponding output signal, as is known by those skilled in the art. FIG. 6 is a simplified timing diagram of the voltage applied to input terminal WL of memory 50 during a read cycle of the DRAM cell. In accordance with FIG. 6, input terminal WL is raised to supply voltage Vcc, thereby coupling capacitors 56 to bit lines BL. Because the DRAM cell is assumed to have a 1 stored therein, (i.e., capacitor 56 is assumed to have been charged to Vcc), bitlines BL is charged to Vcc-Vt voltage.

Erasing the Non-volatile Device

Figure 7:
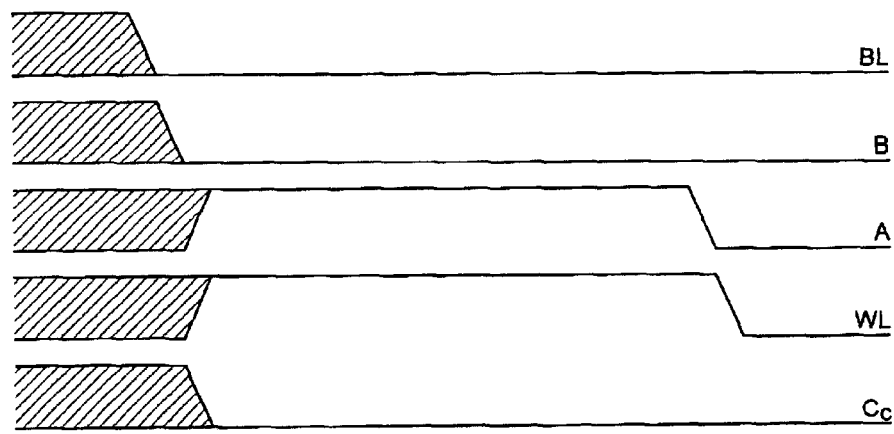
FIG. 7 is a simplified timing diagram of various signals of the non-volatile DRAM of FIG. 2 during an erase cycle.

Non-volatile device 52 is erased before it is programmed. To erase non-volatile device 52, as seen from FIG. 7, Vss voltage (e.g., 0 volts) is applied to both terminals A and B. Guiding gate terminal Cg is kept at the ground or at a relatively small negative potential. A relatively high negative voltage in the range of, e.g., −8 to −12 volts is applied to control gate terminal Cc. The application of these voltages causes any electrons trapped in the nitride layer—formed between the respective control gate region and the substrate region of non-volatile device 54—to return to the substrate region. The tunneling of trapped electrons back to the substrate and/or trapping of holes in the nitride layer causes non-volatile device 54 to erase.

A second way to erase non-volatile device 54 is by injecting hot holes into its nitride layer. To cause hot hole injection, substrate terminal B is pulled to the Vss or a negative voltage, e.g., in the range of −1 to −3 volts. Another voltage in the range of, e.g., 0 to −10 volts is applied to control gate terminal Cc. Guiding gate terminal Cg is maintained at the ground or a negative potential, e.g., −1 to −3 volts. A positive voltage pulse of magnitude of 3 to 7.5 is applied to terminal A. Accordingly, a strong depletion region is formed from the drain to the substrate region of non-volatile device 52. The drain region's doping concentration causes a relatively narrow surface depletion region to form at the interface of the drain region and oxide layer above it. Therefore, band-to-band tunneling takes place causing electrons to tunnel from the surface valence band toward the conduction band, thereby generating holes. The holes so generated drift toward the substrate. Some of these holes gain sufficient energy to inject through the oxide and be trapped in the nitride layer. The injected holes neutralize any electrons that are trapped in the nitride layer, thereby causing the threshold voltage of non-volatile device 52 to return to its pre-programmed (i.e., erased) state.

Programming the Non-volatile Device Using Hot-electron Injection

In accordance with the present invention, if the Vcc voltage supplied by, e.g. a battery, reduces below a certain value, or if there is an abrupt failure in the supply of voltage Vcc or if otherwise desired, data stored in the DRAM cell of memory 50 is stored in the non-volatile device 52 of memory 50. To achieve this, for example, a system capacitor (not shown) is used to store charges while voltage supply is being turned off. The charges stored in the system capacitor are used by a high voltage generator circuit to generate the voltages required to operate the non-volatile memory cell. While the power supply reduction or failure occurs, data stored in the DRAM cell is loaded and stored in the non-volatile device 52.

In order to load the data stored in the DRAM cell in non-volatile device 52, non-volatile device 52 is first erased, as described above. Furthermore, the DRAM is read and refreshed. Therefore, bitline BL is raised to supply voltage Vcc if capacitor 56 is charged to a high voltage. Bitline BL is pulled to 0 volt, if capacitor 56 is discharged to 0 volt.

Figure 8:
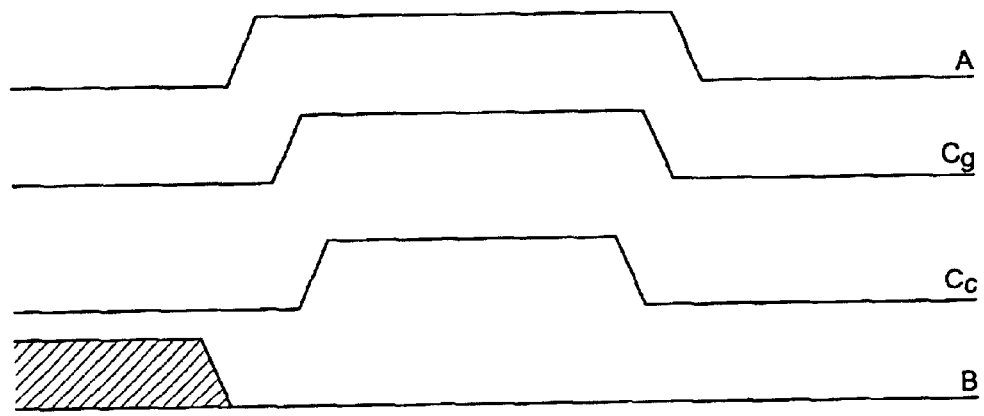
FIG. 8 is a simplified timing diagram of various signals of the non-volatile DRAM of FIG. 2 during another write cycle.

To program non-volatile device 52, as seen from FIG. 8, e.g., 0 volt is applied to substrate terminal B, a relatively high voltage in the range of, e.g., 4 to 12 volts is applied to terminal Cc, a second voltage in the range of, e.g., 0.5 to 1.5 volts is applied to guiding gate terminal Cg, and a third voltage in the range of, e.g., 3 to 6 volts is applied to terminal A of memory 100. A voltage in the range of, e.g., 2.5 to 3.6 volts is applied to terminal WL.

Assume that the DRAM cell has stored a 1 therein, and therefore capacitor 56 (i.e., node N) is charged to, e.g., Vcc volts. Because the voltage applied to the guiding gate is smaller than the voltage at node N (i.e., the source terminal) of non-volatile device 52, no channel is formed under the control gate of non-volatile device 52. Therefore, non-volatile device 52 is not programmed and remains erased.

Assume that the DRAM cell has stored a 0 therein, and therefore capacitor 56 (i.e., node N) is discharged to, e.g., 0 volts. Because the voltage applied to the guiding gate is greater than the voltage of the source terminal of non-volatile device 52, a channel is formed under its guiding gate. A channel is also formed under the control gate of non-volatile device. 52, thereby causing current to flow between the source and drain terminals of non-volatile device 52. A relatively large lateral electric field develops near the gap separating the channel regions formed under the guiding gate and control gate of non-volatile device 52. The relatively high electric filed causes electrons passing through the gap—as they drift from the source to the drain region— to gain the energy required to surmount the silicon-oxide barrier and thus to flow into and get trapped in the nitride layer. The electrons are trapped in the nitride layer under the control gate and are positioned relatively away from the drain region of non-volatile device 52, thereby increasing the threshold voltage of non-volatile device 52. The charges remain trapped in non-volatile device 54 after power is turned off. Therefore, non-volatile device 52 maintains its higher threshold even after power is turned off. The increase in the threshold voltage of non-volatile 52 is used to restore the programming state of the DRAM cell when the power is subsequently restored, as described further below.

Recall of the DRAM Cell

Figure 9:
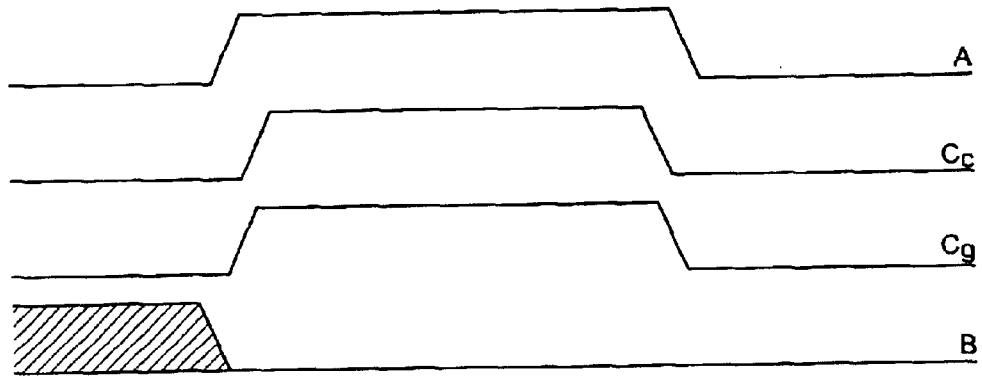
FIG. 9 is a simplified timing diagram of various signals of the non-volatile DRAM of FIG. 2 during a recall cycle.

After the power is restored or as needed, the DRAM cell is recalled, i.e., it is reloaded with data that it had prior to the power-off. To reload the data in the DRAM cell, bitline BL is pulled down to the ground potential and input terminal WL is raised to the Vcc voltage, thus enabling capacitor 56 to discharge to the ground potential. Thereafter, as shown in FIG. 9, a read sensing voltage in the range of, e.g., 1 to 2.5 volts, is applied to terminal A, a voltage in the range of, e.g., 1 to 2.5 volts, is applied to control gate and guiding gate of memory 50, and a voltage in the range of, e.g., 1 to 3.5 volts, is applied to the guiding gate of memory 50. After the recall, the voltage applied to terminal WL is pulled to the ground potential.

If non-volatile device 52 is programmed to have a higher threshold voltage, no current flows from terminal A to node N, thereby keeping node N at the ground potential. If non-volatile device 52 is not programmed to have a higher threshold voltage or is in an erased state, a current flows from terminal A to node N, thereby charging capacitor 56 to recall the DRAM's data.

The above embodiments of the present invention are illustrative and not limitative. The invention is not limited by the type of non-volatile memory transistor disposed in the memory cell of the present invention. Moreover, both N-channel and P-channel transistors may be used to from the DRAM as well as the non-volatile memory cells of the present invention. The invention is not limited by the type of integrated circuit in which the memory cell of the present invention is disposed. For example, the memory cell, in accordance with the present invention, may be disposed in a programmable logic device, a central processing unit, and a memory having arrays of memory cells or any other IC which is adapted to store data.

While the invention is described in conjunction with the preferred embodiments, this description is not intended in any way as a limitation to the scope of the invention. Modifications, changes, and variations, which are apparent to those skilled in the art, can be made in the arrangement, operation and details of construction of the invention disclosed herein without departing from the spirit and scope of the invention.

What is claimed is:

1. A memory cell comprising:
   an MOS transistor having a first current carrying terminal coupled to a first node, a second current carrying terminal coupled to a bitline associated with the memory cell, and a gate terminal coupled to a first terminal of the memory cell; and
   a non-volatile device comprising:
   a substrate region coupled to a second terminal of the memory;
   a source region formed in the substrate region and coupled to the first node;
   a drain region formed in the substrate region and separated from the source region by a first channel region; said drain region being coupled to a third terminal of the memory cell;
   a first gate overlaying a first portion of the first channel region and separated therefrom via a first insulating layer; said first gate coupled to a fourth terminal of the memory cell; and
   a second gate overlaying a second portion of the first channel region and separated therefrom via a second insulating layer; wherein said first portion of the first channel region and said second portion of the channel do not overlap and wherein said second gate is coupled to a fifth terminal of the memory cell.

2. The memory cell of claim 1 wherein said first node has an active capacitor formed thereon.

3. The memory cell of claim 2 wherein the first node receive a voltage from the bitline and maintains the voltage after the MOS transistor is turned off.

4. The memory cell of claim 3 wherein the non-volatile device is adapted to store a charge representative of the voltage of the bitlines during a power-off cycle.

5. The memory cell of claim 4 wherein during the power-off cycle, the second terminal of the memory cell is adapted to receive the first voltage, the third terminal of the memory cell is adapted to receive a second voltage, the fourth terminal of the memory cell is adapted to receive a third voltage, and the fifth terminal of the memory cell is adapted to receive a fourth voltage.

6. The memory cell of claim 5 wherein the fourth voltage is greater than the first, second and third voltages.

7. The memory cell of claim 6 wherein the first voltage is 0 volt.

8. The memory cell of claim 6 wherein during the power-off cycle, the non-volatile devices traps electrons in its nitride layer.

9. The memory cell of claim 8 wherein the electrons are trapped via hot-electron injection.

10. The memory cell of claim 8 wherein after the power-off cycle, the first node stores charges it had prior to the power-off cycle.

11. The memory cell of claim 10 wherein after the power-off cycle, the first voltage is applied to the first and second terminals, the second voltage is applied to the third and fifth input terminals, and a fifth voltage is applied to the fourth terminal, wherein the fifth voltage is smaller than the second voltage.

12. The memory cell of claim 11 wherein the trapped electrons are untrapped by applying the first voltage to first, second and third terminals of the memory cell, applying a negative voltage to the fifth terminal of the memory cell and by enabling the fourth terminal of the memory cell to float.

13. The memory cell of claim 9 wherein said MOS transistor is periodically turned on.

14. The memory cell of claim 1 wherein the MOS transistor is formed in the substrate of the non-volatile device.

15. The memory cell of claim 14 wherein said substrate is a p-type region formed in an n-well.

16. The memory cell of claim 1 wherein said first insulating layer comprises oxide and nitride layers.

* * * * *